(12) United States Patent
Cameron

(10) Patent No.: US 7,080,310 B2
(45) Date of Patent: Jul. 18, 2006

(54) FORWARD ERROR CORRECTOR

(75) Inventor: Kelly Cameron, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 115 days.

(21) Appl. No.: 10/733,823

(22) Filed: Dec. 11, 2003

(65) Prior Publication Data

US 2004/0123225 A1 Jun. 24, 2004

Related U.S. Application Data

(63) Continuation of application No. 10/382,400, filed on Mar. 6, 2003, now Pat. No. 6,684,364, which is a continuation of application No. 09/951,998, filed on Sep. 12, 2001, now Pat. No. 6,539,516, which is a continuation of application No. 09/437,448, filed on Nov. 9, 1999, now Pat. No. 6,317,858.

(60) Provisional application No. 60/107,879, filed on Nov. 9, 1998.

(51) Int. Cl.
*H03M 13/00* (2006.01)

(52) U.S. Cl. ................. 714/785; 714/784; 714/782

(58) Field of Classification Search ............... 714/785, 714/784, 782
See application file for complete search history.

(56) References Cited

U.S. PATENT DOCUMENTS

| | | | |
|---|---|---|---|
| 5,099,482 A | 3/1992 | Cameron | |
| 5,170,399 A | 12/1992 | Cameron et al. | |
| 5,446,743 A * | 8/1995 | Zook | 714/784 |
| 5,592,404 A | 1/1997 | Zook | |
| 5,640,286 A | 6/1997 | Acosta et al. | |
| 5,689,452 A | 11/1997 | Cameron | |
| 5,727,003 A | 3/1998 | Zook | |
| 5,844,919 A | 12/1998 | Glover et al. | |
| 5,964,826 A | 10/1999 | Wei | |
| 5,970,075 A | 10/1999 | Wasada | |
| 5,971,607 A | 10/1999 | Im | |
| 5,974,582 A | 10/1999 | Ly | |
| 5,974,583 A | 10/1999 | Joo | |
| 5,978,950 A | 11/1999 | Im | |
| 5,978,956 A | 11/1999 | Weng et al. | |
| 6,092,233 A | 7/2000 | Yang | |
| 6,119,262 A | 9/2000 | Chang et al. | |
| 6,209,115 B1 | 3/2001 | Truong et al. | |
| 6,317,858 B1 | 11/2001 | Cameron | |

FOREIGN PATENT DOCUMENTS

| | | |
|---|---|---|
| EP | 08080129 A2 | 11/1997 |
| WO | WO 97/27675 A | 7/1997 |

OTHER PUBLICATIONS

Blahut, E.R. *Theory and Practice of Error Control Codes*, 1984, pp. 176-178, pp. 191-193, Addison-Wesley Publishing Company, London. (XP002131806).

(Continued)

*Primary Examiner*—Joseph D. Torres
(74) *Attorney, Agent, or Firm*—Christie, Parker & Hale, LLP

(57) ABSTRACT

A method for decoding an algebraic-coded message including determining a discrepancy indicator; determining an error locator polynomial according to a modified Berlekamp-Massey algorithm such that an uncorrectable message is detected; and producing a perceptible indication of the detected uncorrectable message. An apparatus includes storage devices, arithmetic components, and an uncorrectable message detector.

5 Claims, 5 Drawing Sheets

OTHER PUBLICATIONS

Fleishchmann, M., "Modified Berlekamp-Massey Algorithm for Two Sided Shift Register Synthesis," *Electronic Letters*, Apr. 13, 1995, pp. 605-606, vol. 31, No. 8.

Reed, et al., "VLSI Design of Inverse-Free Berlekamp-Massey Algorithm," *IEE Proceedings E [see also Computers and Computers and Digital Techniques, IEE Proceedings-]*, Sep. 1991, pp. 295, Digital Techniques vol. 138, Issue 5.

Trieu-Kien, Truong, et al., "Inversionless Decoding of Both Errors and Erasures of Reed-Solomon Code," *IEEE Transactions on Communication*, Aug. 1998, pp. 973-976, vol. 46, No. 8, IEEE, USA. (XP002131805).

Wicker, Stephen B., *Error Control Systems*, 1995, Prentice-Hall.

Youzhi, Xu, "Implementation of Berlekamp-Massey Algorithm without Inversion," *IEE Proceedings \Speech and Vision Communication* , Jun. 1991, pp. 138-140, vol. 138, Issue 3.

\* cited by examiner

US 7,080,310 B2

FORWARD ERROR CORRECTOR

CROSS-REFERENCE TO RELATED APPLICATION

This patent application is a continuation of U.S. patent application Ser. No. 10/382,400 filed Mar. 6, 2003, now U.S. Pat. No. 6,684,364 which is a continuation of U.S. patent application Ser. No. 09/951,998 filed Sep. 12, 2001 now U.S. Pat. No. 6,539,516 issued Mar. 25, 2003, which is a continuation of U.S. patent application Ser. No. 09/437,448 filed Nov. 9, 1999 now U.S. Pat. No. 6,317,858 issued Nov. 13, 2001, which claims priority on the basis of the provisional patent application Ser. No. 60/107,879 filed Nov. 9, 1998.

BACKGROUND OF THE INVENTION

1. Field of the Invention

The present invention relates to an apparatus for correcting errors present in stored or transmitted data; and, more particularly, to an apparatus for evaluating an error evaluator polynomial, an error locator polynomial and a differential polynomial which are used in correcting errors in the data encoded by using an algebraic code, such as a Reed-Solomon code.

2. Description of Related Art

Noise occurring during a process of transmitting, storing or retrieving data can in turn cause errors in the transmitted, stored or retrieved data. Accordingly, various encoding techniques, having the capability of rectifying such errors, for encoding the data to be transmitted or stored have been developed.

In such encoding techniques, a set of check bits is appended to a group of message or information bits to form a codeword. The check bits, which are determined by an encoder, are used to detect and correct the errors. In this regard, the encoder essentially treats the bits comprising the message bits as coefficients of a binary message polynomial and derives the check bits by multiplying the message polynomial $R(x)$ with a code generator polynomial $G(x)$ or dividing $R(x)$ by $G(x)$, to thereby provide a codeword polynomial $C(x)$. The code generator polynomial is selected to impart desired properties to a codeword upon which it operates so that the codeword will belong to a particular class of error-correcting binary group codes (see, e.g., S. Lin et al., "Error Control Coding: Fundamentals and Applications", Prentice-Hall, 1983).

One class of error correcting codes is the well-known BCH (Bose-Chaudhuri-Hocquenghen) codes, which include the Reed-Solomon ("RS") code. The mathematical basis of the RS code is explained in, e.g., the aforementioned reference by Lin et al. and also in Berlekamp, "Algebraic Coding Theory", McGraw-Hill, 1968, which is further referred to in U.S. Pat. No. 4,162,480 issued to Berlekamp. The aforementioned references are hereby incorporated by reference in pertinent part.

SUMMARY OF THE INVENTION

The invention herein provides a method and apparatus for decoding an algebraic-coded message. The method can include the steps of determining a discrepancy indicator, with the discrepancy being between a calculated and a predicted value; determining an error locator polynomial using a selected class of error correction algorithms, such as, for example, a Berlekamp-Massey algorithm; and detecting an uncorrectable message using the selected error correction algorithm. The apparatus is composed of storage devices which can include recirculating storage devices; arithmetic components attached to the storage devices, the components operating over a Galois Field on selected contents of the storage devices; and an uncorrectable message detector, connected with the storage devices and the arithmetic components.

EXEMPLARY EMBODIMENTS OF THE INVENTION

Figure 1:
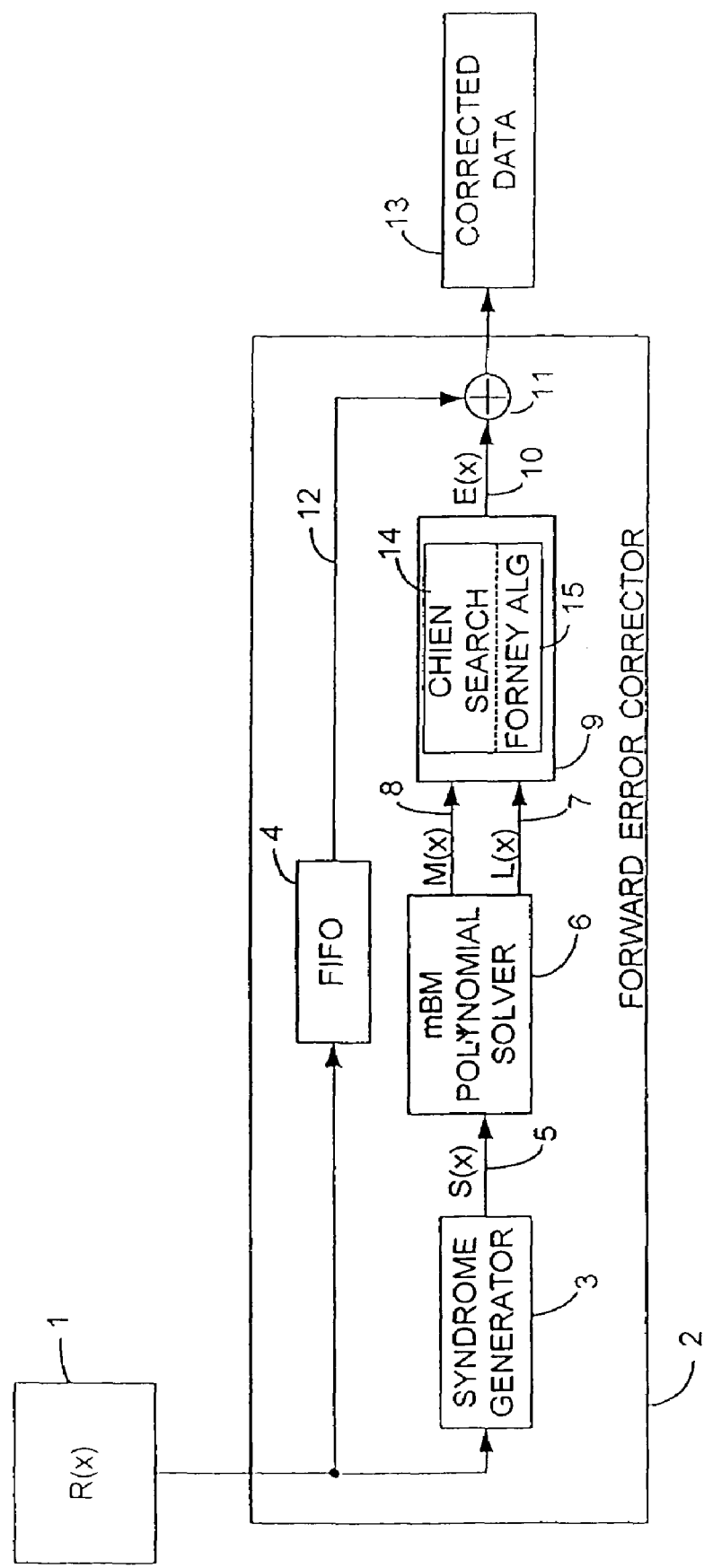
FIG. 1 is an illustration of a algebraic decoder according to the invention herein.

The invention herein provides an apparatus for and a method of decoding algebraic codes, including BCH codes, and more specifically, Reed-Solomon codes, such that uncorrectable messages, or portions of received encoded data, are detected. Furthermore, the invention herein provides for a more area-efficient device implementation of the aforementioned method. For the purposes of illustration, the present invention will be described in terms of a subset of the BCH codes, namely Reed-Solomon (RS) codes.

The Reed Solomon (RS) encoding technique appends to each block of k user data symbols 2t redundancy symbols to create an encoded message block (where t represents the designed symbol error correcting capacity of the code). These 2t symbols, or elements, are selected from the Galois Field to be the roots of the generator polynomial. Therefore, there are k+2t symbols in a RS-encoded message block. The entire message block is viewed as a polynomial and evaluated as a polynomial at some Galois Field element. The Galois Field element at which the polynomial is evaluated will be located at one roots of the generator polynomial that are used to create the RS code. The RS code views the n-bit symbols as elements of a Galois Field (GF(2n)). A Galois field is a finite field, the elements of which may be represented as polynomials in a, where a is a root of an irreducible polynomial of degree n. The RS codeword consists of a block of n-bit symbols. Typically, n=8 and the 8-bit symbols are referred to as bytes. Constructing the Galois field GF(2n) requires a defining polynomial $F(x)$ of degree n. In addition, a primitive element $\beta$ is chosen so that every nonzero element of GF(2n) is a power of $\beta$. The element $\beta$ is not necessarily a root of $F(x)$.

A RS codeword C is viewed as a polynomial $C(x)$ and the redundancy symbols are chosen so that the roots of $C(x)$ include the roots of a generator polynomial $G(x)$ whose roots are 2t consecutive powers of $\beta$. The k user data symbols are viewed as the high order coefficients of a degree k+2t−1 polynomial, and the redundancy symbols are the coefficients of the remainder when this polynomial is divided by $G(x)$.

The process of corrupting the original code block $C(x)$ with errors can be viewed as adding an error polynomial E(x) to C(x). The resultant corrupted polynomial is known as the received polynomial R(x), where R(x)=C(x)+E(x). The v non-zero terms of the error polynomial contain the necessary information to completely reconstruct the original data C(x), since each term corresponds to a symbol error location and magnitude.

Typically, RS decoding is a tripartite analysis: (1) syndrome computation; (2) solution of the error magnitude and locator polynomials; and (3) error location and magnitude estimation by respective implementations of, for example, a Chien search and the Forney algorithm. The syndromes contain error information divorced form the actual information that is intended to be analyzed for errors. The error locator polynomial provides information regarding the location of an error in the received signal, and the magnitude of the error can be determined by using both the magnitude and the locator polynomials.

The thrust of the RS error correction procedure is to reconstruct the error polynomial E(x). Three polynomials are used to correct a received polynomial R(x): S(x), a syndrome polynomial; $\Lambda(x)$, an error locator (or error location) polynomial; and M(x) an error magnitude polynomial. The syndromes are computed by evaluating the polynomial R(x) at all roots of G(x). These values are called syndromes and the syndrome polynomial S(x) has these values as coefficients. The syndrome polynomial S(x) is used to determine the existence of errors. The error locator polynomial $\Lambda(x)$ and the error magnitude polynomial M(x) are computed from S(x) by a key equation solver. The roots of the error locator polynomial $\Lambda(x)$ indicate positions in the data that are erroneous and both the error locator polynomial $\Lambda(x)$ and the error magnitude polynomial M(x) are used to determine the true values of the erroneous data.

Two frequently-used RS error correction algorithms are the Berlekamp-Massey and the Euclid algorithms. The present invention recasts the Berlekamp-Massey algorithm such that the inversion process typically associated with the traditional Berlekamp-Massey (tBM) algorithm is eliminated. This is important because the inversion process includes determining the reciprocal of certain Galois field elements using division. Division is a time consuming arithmetic operation, the implementation of which can occupy needed component area in a device design. Therefore, the present invention can be particularly advantageous where area-efficient layout of a decoder device is desirable.

For further elaboration of the decoding process over Galois fields, including tBM, Chien searching, and Forney's Algorithm, see *Theory and Practice of Error Control Codes* by Richard E. Blahut (Addison-Wesley, 1983) which is incorporated by reference in pertinent part herein.

FIG. 1 illustrates an implementation of this algorithm, in which a raw received signal 1 is directed to RS decoder unit 2 that is used to determine the error locations and error values. Signal 1 is provided to syndrome generator 3 and delay unit 4. In syndrome generator 3, the several syndromes 5 associated with the selected encoding are derived and transmitted to polynomial solver 6. The syndrome generator 3 calculates one syndrome for each of the 2t roots of G(x). Polynomial solver 6 utilizes the syndromes to determine the coefficients of the error location polynomial $\Lambda(x)$ 7 and the coefficients of the error magnitude polynomial M(x) 8, which in turn are transmitted to error estimator 9. Estimator 9 calculates error signal 10 which is combined in summer 11 with delayed raw received input 12 to provide corrected data 13. Estimator 9 can include Chien search unit 14 which utilizes the error location polynomial $\Lambda(x)$ to search for the roots of the error locator polynomial, $r_1, \ldots, r_v$. Typically, the Chien search unit 14 employs a root finding technique which involves evaluating the error locator polynomial at all elements in the field $GF(2^n)$. The roots of the error locator polynomial $r_1, \ldots, r_v$ determine the error locations. The error values are then determined using Forney's algorithm unit 15. The delayed raw received input 12 is then corrected using the output of the Forney algorithm unit 15 and the raw received input which is transmitted by delay unit 4.

Traditionally, the Berlekamp-Massey (tBM) algorithm, which usually is realized in polynomial solver 6 can described by:

$$\Delta_r = \sum_{j=0}^{n-1} \Lambda_j^{(r-1)} S_{r-j} \tag{1}$$

$$L_r = \delta_r(r - L_{r-1}) + (1 - \delta_r) L_{r-1} \tag{2}$$

$$\begin{bmatrix} \Lambda^{(r)}(x) \\ B^{(r)}(x) \end{bmatrix} = \begin{bmatrix} 1 & -\Delta_r x \\ \Delta_r^{-1} \delta_r & (1-\delta_r)x \end{bmatrix} \begin{bmatrix} \Lambda^{(r-1)}(x) \\ B^{(r-1)}(x) \end{bmatrix} \tag{3}$$

r=1, ..., 2t where $\delta_r=1$ if both $\Delta_r \neq 0$ and $2L_{r-1} \leq r-1$, and otherwise $\delta r=0$. Then $\Lambda^{(2t)}(x)$ is the smallest-degree polynomial with the properties that $\Lambda_0^{(2t)}=1$, and $$S_r + \sum_{j=1}^{n-1} \Lambda_j^{(2t)} S_{r-j} = 0 \quad r = L_{2t}+1, \ldots, 2t$$

where initial conditions are $\Lambda^{(0)}(x)=1$, $B^{(0)}(x)=1$, and $L_0=0$.

It is evident that the inversion indicated in Eq. 3 requires a division operation.

The tBM algorithm is capable of properly decoding messages that can be decoded properly, however if there is an uncorrectable case which is detectable as being uncorrectable, the uncorrectable error may be undetected and the message decoded as if it did contain a correctable error. Many times, this improperly decoded message can create additional difficulties because the error may propagate through other processes in the system which employs tBM.

According to the invention herein, the modified Berlekamp-Massey (mBM) can be described by the following equations:

$$\Delta_i = \sum_{j=1}^{2t} \Lambda_{i-1}^{j-1} S^{i-j} \tag{4}$$

$$\Lambda_i = \Lambda_- \Lambda_{i-1} + x \Delta_i B_{i-1} \tag{5}$$

$$B_i = \begin{cases} \Lambda_{i-1} & \Lambda_- = \Lambda_i \\ x B_{i-1} \end{cases} \tag{6a}$$
$$\tag{6b}$$

where:
$\Lambda \neq 0$
$B_0 = 1$
$\Delta_{-1} = 1$

Utilization of mBM for RS decoding can be advantageous because: (1) inversion is eliminated; (2) the control structure associated with the mBM algorithm is simplified relative to that of tBM; and (3) the termination conditions of tBM are modified such that if the code is uncorrectable, errors otherwise undetected by tBM, are detected and flagged as such.

One implementation of the mBM algorithm is as follows, as represented in Pascal code:

mentations also may be used in the context of extended Reed-Solomon codes which, in the example herein, would have 256 elements in the message block, i.e., have 256 elements in associated the Galois Field. It is desirable that, in step 21, the control variables DEG, PWR, and STATE, as well as error locator variables be initialized. It further is desirable to iterate through steps 23, 24, 25, and 26, 2t times, where 2t is the number of syndrome polynomials to be evaluated, and t is the error correcting capability of the preselected code. Thus, at step 30, a counter tracking the

```
PROCEDURE FindLocatorBMC( VAR Syndrome, Locator:Polynomial;
VAR OK:BOOLEAN );
VAR        Cnt: 0..MaxParitySyms-1;          { Loop Index                  }
           Pwr: 0..MaxParitySyms;            { Power Counter               }
           State: (Alpha,Beta);              { State Machine State         }
           Deg:   INTEGER;                   { Degree                      }
           Del, Del0: Words;                 { Discrepancies               }
           J:   INTEGER;                     { Del Index                   }
           TempPoly  : Polynomial;           { Temporary Polynomial        }
           B         : Polynomial;           { Secondary Polynomial        }
BEGIN                                        { BEGIN FindLocatorBMC        }
    B.L. := 0; B.D [0] :=1;                  { Initial B                   }
    Locator.L := 0; Locator.D [0] :=1;       { Initial Locator Poly        }
    Deg := 0; Pwr := 0; Del0 := 1;           { Cntr Initialization         }
    State := Alpha;                          { Machine State               }
    FOR Cnt := ParitySyms-1 DOWNTO 0 DO BEGIN { Algorithm Loop             }
       Del := 0;                             { Calculate Del               }
       FOR J := 0 TO LOCATOR.L DO
         IF Syndrome.L >= (ParitySyms-1-Cnt-J) THEN
           Del:= Add( Del, Multiply( Locator.D[J], Syndrome.D[ParitySyms-1-Cnt-J]));
       TempPoly :=                            { Do Common Update            }
   PolyAdd( WordTimes( Locator, Del0 ), PolyShift( WordTimes( B, Del ), 1) );
       IF (State=Alpha) AND (Del<>0) THEN BEGIN   { Do Step A               }
{ writeln( stderr, '         B<-L' );}
           B := Locator;
           Del0 := Del
           END                                { Do Step A                   }
       ELSE BEGIN                             { Do Step B                   }
{ writeln( stderr, '         B<-xB' );}
           B := PolyShift( B, 1 )
           END;                               { Do Step B                   }
       IF State=Alpha THEN BEGIN              { State is Alpha              }
           IF Del=0 THEN Pwr := Pwr +1        { Increment Power Cntr        }
           ELSE State := Beta                 { Update Next State           }
           END                                { State is Alpha              }
       ELSE BEGIN                             { State is Beta               }
           Deg := Deg+1;
           IF Pwr = 0 THEN State := Alpha     { Update Next State           }
           ELSE Pwr := Pwr-1                  { Decrement Power Cntr        }
           END;                               { State is Beta               }
       Locator := TempPoly                    { Update Locator              }
       END;                                   { Algorithm Loop              }
    Locator := PolyDenormalize( Locator, Deg); {Update Locator Degree       }
    OK := State=Alpha
END;                                          { END FindLocatorBMC          }
```

Often, when a forward error corrector properly detects an uncorrectable error, the existence of such an error usually is verified in a process by which the syndrome polynomials are recomputed. This approach can carry a substantial penalty relative to the process efficiency. Instead, an embodiment of the invention herein, having an improved control structure, verifies the existence of an uncorrectable error by checking the state of polynomial solver 6 at the end of the polynomial solving process.

Figure 2:
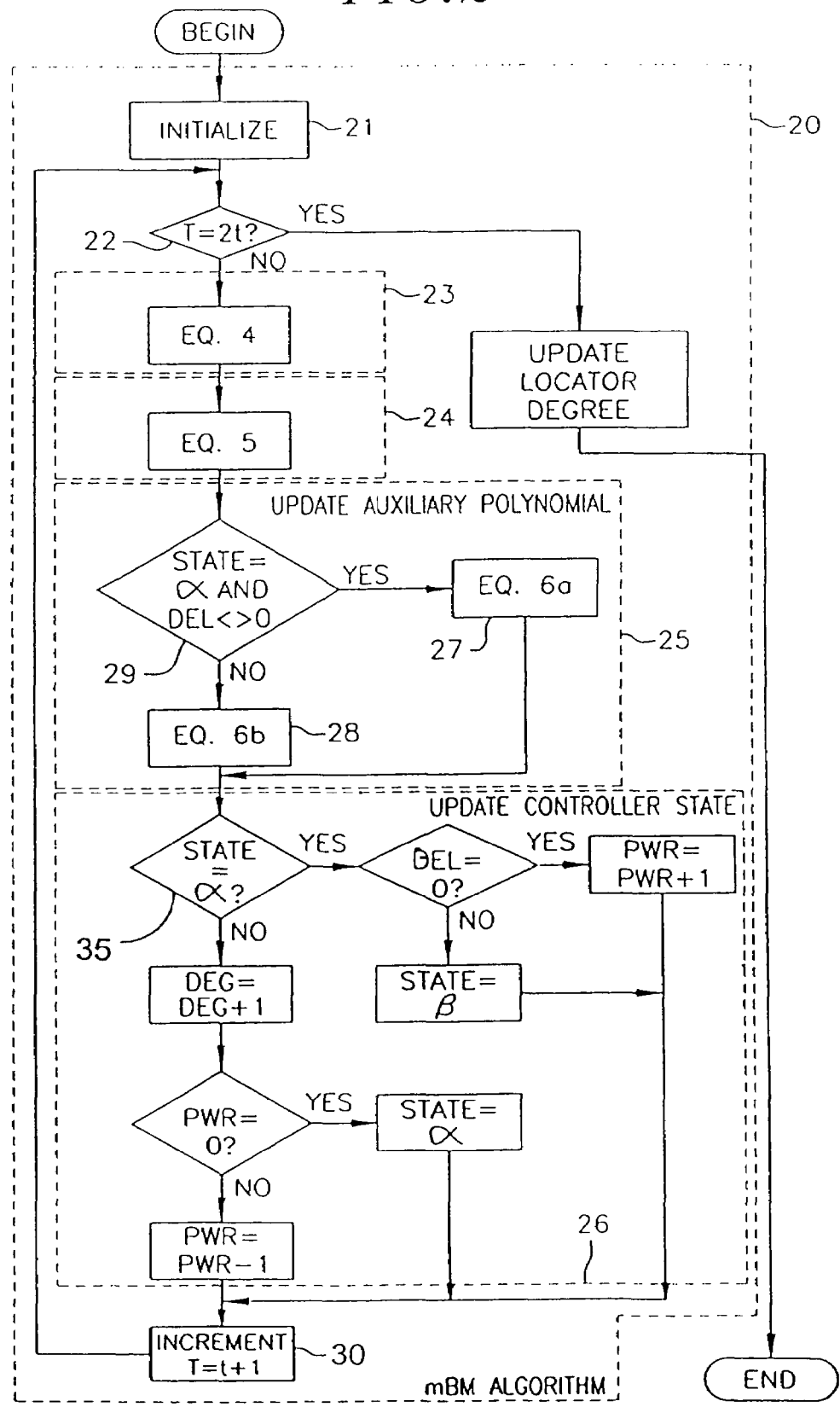
FIG. 2 is a data flow diagram of a modified Berlekamp-Massey algorithm according to the invention herein.

FIG. 2 exemplifies an embodiment of the process 20 implementing the aforementioned improved control structure in the context of the mBM algorithm recited in Equations 4, 5, and 6(a)–(b). Although the implementations described herein are postured for standard RS codes having a block length of, for example, 255 elements, such implenumber of completed iterations is employed. No additions or subtractions are needed in implementing the control variables, and only count up or down functions are used. Step 23 essentially implements Equation 4, in which the discrepancy value DEL, associated with a particular iteration, is determined. Similarly, step 24 implements Equation 5 in which the error locator polynomial is updated. In step 25, auxiliary polynomial $B_i$ is updated according to Equation 6a in substep 27, or Equation 6b in substep 28, based on conditions determined by logic 26. For logic 29, it is desirable for both STATE=ALPHA AND DEL< >zero to direct the data flow via an implementation of Equation 6a in substep 27; otherwise substep 28 is used, implementing Equation 6b. Unlike the tBM algorithm where the polynomial shift term $(1-\delta_r)X$ in Equation 3 has been normalized, the mBM algorithm does not require normalization, avoiding an inversion/division operation. After the auxiliary polynomial is updated in step 25, the controller state is updated in step 26.

In general, the degree of the error locator polynomial is tracked by DEG, which is an upcounter descriptive of the true degree of the error locator polynomial and, thus, the number of errors in the message block. It also is desirable to construct an error locator polynomial who roots equate to the locations of an error. Essentially, process 20 attempts to synthesize a linear feedback shift register (LFSR) that predicts the values of the syndrome polynomial. Such a LFSR can be useful to find the error locations. Discrepancy value, DEL, then exposes a discrepancy between the predicted value of the syndrome polynomial, and the value of the current syndrome polynomial, and invites further processing to discover the location of the errors. PWR is a counter that keeps track of the number of times that the controller previously remained in STATE=ALPHA. It is desirable to have the STATE remain in control state BETA for a count equivalent to the number of times that STATE previously remained in control state ALPHA.

For the purposes of the invention herein, STATE can be used to (1) determine whether the error correction analysis ought to follow the flow of Equation 6a or 6b; (2) assist in determining whether the degree of the error locator polynomial ought to be increased; and (3) whether there exists an uncorrectable error. At the end of 2t iterations, the value of STATE is once again determined at step 35. If the result is STATE=ALPHA, then the code is potentially valid; on the other hand, if STATE=BETA, then the error is flagged as uncorrectable. Potentially valid codes where STATE=ALPHA at step 35, also can be subjected to additional validation before being subsequently decoded. Indeed, in one subsequent operation, the number of the error locator polynomial zeroes is compared with the value of DEG. A discrepancy between these two values also is indicative of an uncorrectable error.

Figure 3:
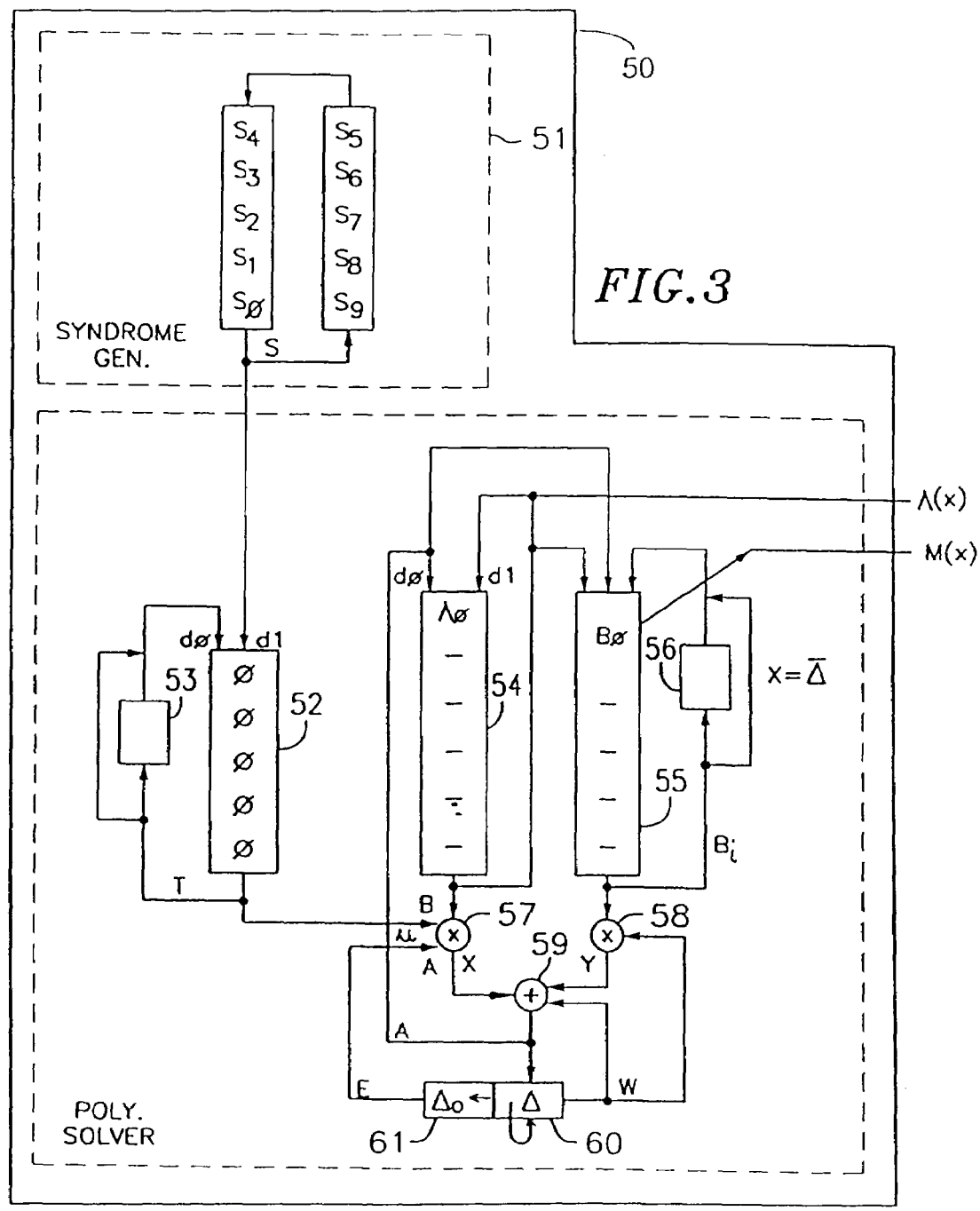
FIG. 3 is a block diagram illustrative of an exemplary embodiment of the present invention.

FIG. 3 is an exemplary embodiment of a polynomial solver using the mBM algorithm. Solver 50 can include syndrome generator register 51, recirculating syndrome register 52, first delay register 53, locator polynomial ($\Lambda_i$) register 54, auxiliary polynomial ($B_i$) register 55, second delay register 56, first multiplier 57, second multiplier 58, adder 59, $\Delta_i$ register 60, and $\Delta$ register 61. In another embodiment, syndrome generator 51 can be separate from solver 50. It is desirable for multipliers 57, 58, and adder 59 to operate on Galois Field elements. It also is desirable for register 51 to be logically arranged as a circular register or loop, such that particular register values can be used in a pre-defined sequence. Furthermore, it is desirable that registers 52, 54, and 55 be logically arranged as push-down stacks or FIFOs, and also that the values contained therein rotate synchronously. The error locator polynomial $\Delta_i$ are arranged in register 54 such that the least significant coefficient is at the top and the stack "grows down" as subsequent values are determined. It is desirable for the syndrome recirculating register 52 to operate such that the least significant coefficient is aligned with the bottom of the register, and the most significant with the top.

In the example of FIG. 3, the error correcting capability, t, is selected to be 5 elements and, thus, syndrome register 51 is designed to employ 2t, or 10, individual elements. Additionally, register 52 is selected to use t elements, register 54 is chosen to employ t+1 elements, and register 55 is intended to operate with t elements.

Initially, recirculating syndrome register 52 is pre-loaded with zeroes. As expressed in the aforementioned algorithm, an initial step involves calculating the discrepancy value DEL, which can be stored in register 60. A previous value for DEL, DEL0, is provided in register 61. To calculate the initial value for DEL, first syndrome value $S_0$ is shifted into register 52, which value is received in first multiplier 57 along with the initial value of DEL, namely, DEL0, and the t-th value in locator polynomial register 54. After the indicated multiplication and creation of a DEL value, the values in registers 52, 54, and 55 are shifted down by one element. At first, the values in register 52 are zero, however, with subsequent clocking, successive values of $S_i$ enter register 52 and are recirculated therethrough, for the clock cycles equivalent to i=0 to 2t−1. As $S_0$ exits register 52 into first multiplier 57, corresponding values of $\Lambda_0$ are also transmitted to first multiplier 57 such that the value $S_0\Lambda_0$ is determined.

Concurrently with this calculation, value $B_0$ from register 55 is multiplied with then extant value for DEL in second multiplier 58 and the result is summed with $S_0\Lambda_0$ in adder 59 to produce the next value for DEL. This value of DEL is used to produce the next value for the error locator polynomial, namely, $\Lambda_1$. After this calculation, value $S_0$ is recirculated such that it bypasses first delay register 53 and re-enters recirculating register 52 at the top of the stack during the next clock cycle. During this next clock cycle, syndrome value $S_1$ is aligned, and multiplied, with $\Lambda_0$, and $S_0$ is aligned, and multiplied, with $\Lambda_1$. This process repeats such that each of the syndrome values properly iterates through in the evaluation of the locator polynomial.

With the above information, a skilled artisan would be able to see the manner in which the values for error locator polynomial $\Lambda_i$ and auxiliary polynomial $B_i$ are determined. Where it is desired to rotate the values of $B_i$ through register 55, second delay register 56 is bypassed. On the other hand, where it is desirable to utilize a previously calculated value of $B_i$, as indicated in the aforementioned algorithm, the value of $B_i$ is directed into second delay register 56.

Continuing in FIG. 3, calculation of the magnitude polynomial will be described. At the completion of 2t iterations as described above, register 52 will contain values $S_4$–$S_8$. In essence, determination of the magnitude polynomial can be modeled as $M(x)=\Lambda(x)S(x) \bmod x^{2t}$, in which the multiplication will be truncated after the 2t term. Indeed, only t terms need be determined under the assumption that no uncorrectable error was encountered. During the final iterations of the calculation of the error locator polynomial, register 52 is loaded with zeros such that, at the completion of 2t iterations, all storage locations in register 52 contain a zero value. After 2t iterations, the values in register 51 will be restored to their original positions, register 52 will contain all zero values and register 54 will contain the error locator polynomial, $\Lambda_i$. In am manner similar to the computation of the locator polynomial coefficients, the error magnitude coefficients are calculated iteratively. After t iterations, $S_0$ will be at the logical bottom of register 52 and $\Lambda_0$ at the logical bottom of register 54. At the completion of t+1 iterations, the product of multiplier 57 will be $S_0\Lambda_0$, the first term of the error magnitude polynomial. The output of adder 59 is directed to the logical top of register 55, which now will be used to build the magnitude polynomial. After iteration t+2, syndrome value $S_0$ will be aligned with locator value $\Lambda_1$, giving the product $S_0\Lambda_1$; syndrome value S1 will be aligned with $\Lambda_0$, giving the product $S_1\Lambda_0$; the summation of which giving $S_0\Lambda_1+S_1\Lambda_0$, which is the second term of the error magnitude polynomial. This process will continue until all values of M(x) are so determined. At iteration 2t, all of the coefficients for the error magnitude polynomial will have been calculated. At this point, data flow of the error locator polynomial in register 54 and the error magnitude polynomial in register 55 can be directed out of solver 50.

Figure 4:
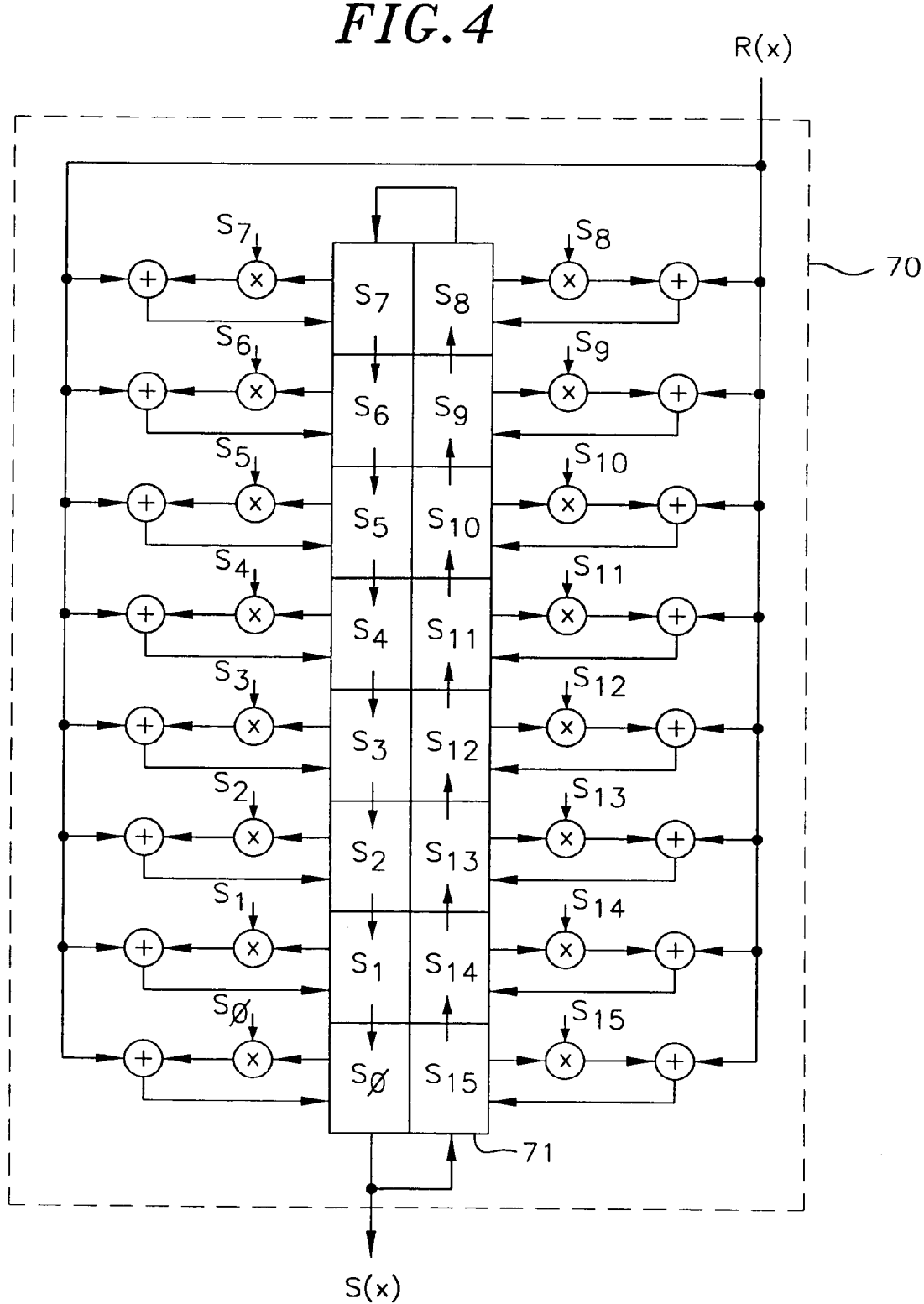
FIG. 4 is a block diagram of a circular syndrome generator according to the present invention.
Figure 5:
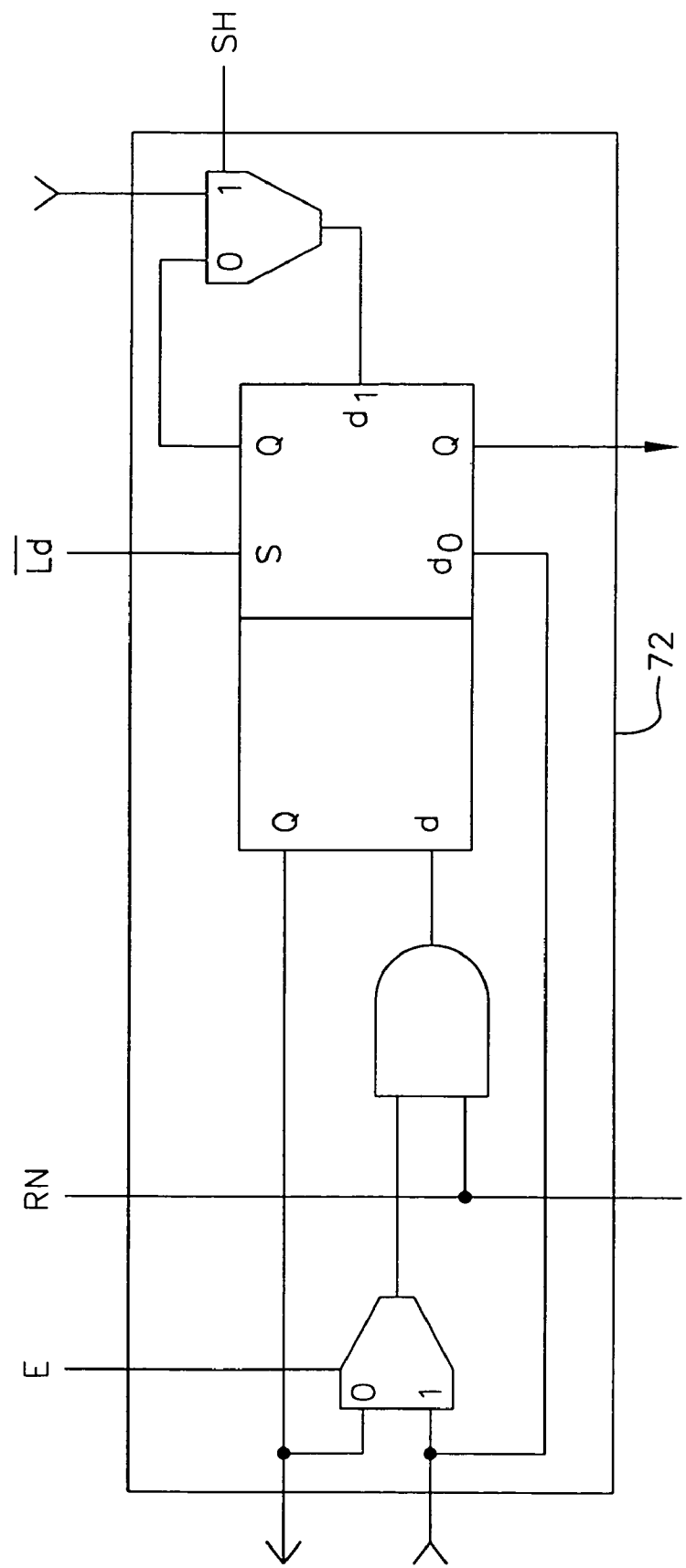
FIG. 5 is a block logic diagram of a logic register which can be used in the circular syndrome generator illustrated in FIG. 4.

FIG. 4 illustrates one embodiment of a circular syndrome generator 70 that can be employed as register 51 in FIG. 3, modified to accommodate an error correcting capability of t=8. FIG. 5 is an embodiment 72 of one of the individual registers 71 in circular syndrome generator 70 in FIG. 4. Although a circular syndrome generator is shown, it is by no means the only form of syndrome generator that can be employed as register 51.

The foregoing merely illustrates the principles of the invention, and it will thus be appreciated that those skilled in the art will be able to devise various alternative arrangements which, although not explicitly described herein, embody the principles of the invention within the spirit and scope of the following claims.

What is claimed is:

1. An apparatus for correcting an algebraic-coded message comprising:
    a message receiver receiving a syndrome polynomial of the algebraic-coded message, the syndrome polynomial including redundancies usable to determine an existence of errors, a location and magnitude of errors and discrepancy values;
    a plurality of polynomial storage devices being adapted to store polynomials;
    a plurality of discrepancy value storage devices being adapted to store discrepancy values;
    one or more arithmetic-logic components, operably connected to the polynomial storage devices, the discrepancy value storage devices, and the message receiver; and
    an inversionless calculator, operably connected to the polynomial storage devices, the discrepancy value storage devices, the message receiver, and the arithmetic-logic components, the inversionless calculator correcting errors in the algebraic-coded message performing inversionless calculations using the syndrome polynomial and using the polynomial storage devices to store different states of progress of the inversionless calculations and the discrepancy value storage devices to store discrepancy values discovered in the algebraic-coded message;
    a binary state storage device being adapted to store a binary state, operably connected to the inversionless calculator and the arithmetic-logic components; and
    an uncorrectable error indicator, operably connected to the inversionless calculator and the arithmetic-logic components, the inversionless calculator iterating through the location of errors in the algebraic-coded message, while:
        determining the existence of errors, the location and magnitude of the errors and the discrepancy values in the algebraic-coded message,
        storing a state variable in the binary state storage device before a first iteration to indicate that no uncorrectable error has been detected and iterating through the errors while updating the state variable to indicate whether an uncorrectable error has been detected,
        using the uncorrectable error indicator to indicate that the algebraic-coded message is uncorrectable if the state variable contains an indication that an uncorrectable error has been detected after a final iteration, and
        using the uncorrectable error indicator to indicate that the algebraic-coded message is not uncorrectable if the existence of no errors has been determined or the state variable contains an indication that no uncorrectable error has been detected after the final iteration.

2. The apparatus of claim 1, wherein the inversionless calculator temporarily stores the discrepancy values in a first discrepancy value storage device of the plurality of discrepancy value storage devices and a second discrepancy value storage device of the plurality of discrepancy value storage devices, storing in the second discrepancy value storage device temporarily the last value previously stored in the first discrepancy value storage device.

3. The apparatus of claim 1, wherein the binary state storage device is adapted to store a Boolean variable.

4. The apparatus of claim 1, wherein the plurality of polynomial storage devices is three.

5. The apparatus of claim 4, wherein the first polynomial storage device stores the current state of progress of the inversionless calculations;
    the second polynomial storage device stores a resulting state of the current inversionless calculations useable in a next iteration of the inversionless calculator; and
    the third polynomial storage device stores a previous state of the inversionless calculations.

* * * * *